(12) United States Patent
Feick

(10) Patent No.: US 11,527,670 B2
(45) Date of Patent: Dec. 13, 2022

(54) PHOTON AVALANCHE DIODE AND METHODS OF PRODUCING THEREOF

(71) Applicant: Infineon Technologies Dresden GmbH & Co. KG, Dresden (DE)

(72) Inventor: Henning Feick, Dresden (DE)

(73) Assignee: Infineon Technologies Dresden GmbH & Co. KG, Dresden (DE)

(*) Notice: Subject to any disclaimer, the term of this patent is extended or adjusted under 35 U.S.C. 154(b) by 329 days.

(21) Appl. No.: 16/789,730

(22) Filed: Feb. 13, 2020

(65) Prior Publication Data

US 2021/0257508 A1    Aug. 19, 2021

(51) Int. Cl.
| | |
|---|---|
| *H01L 31/107* | (2006.01) |
| *G01J 1/44* | (2006.01) |
| *H01L 31/02* | (2006.01) |
| *H01L 31/0224* | (2006.01) |

(52) U.S. Cl.
CPC .............. *H01L 31/107* (2013.01); *G01J 1/44* (2013.01); *H01L 31/02027* (2013.01); *H01L 31/022408* (2013.01); *G01J 2001/4466* (2013.01)

(58) Field of Classification Search
CPC .............. H01L 31/107; H01L 31/02027; H01L 31/022408; G01J 2001/4466
See application file for complete search history.

(56) References Cited

U.S. PATENT DOCUMENTS

| | | | |
|---|---|---|---|
| 2018/0090536 | A1 | 3/2018 | Mandai et al. |
| 2021/0257508 | A1* | 8/2021 | Feick ................ H01L 31/03529 |

FOREIGN PATENT DOCUMENTS

| | | |
|---|---|---|
| CN | 106449770 A | 2/2017 |
| EP | 1596439 A2 | 11/2005 |
| EP | 3544064 A1 | 9/2019 |
| WO | 2019002252 A1 | 1/2019 |

* cited by examiner

*Primary Examiner* — Mark V Prenty
(74) *Attorney, Agent, or Firm* — Murphy, Bilak & Homiller, PLLC

(57) ABSTRACT

A photon avalanche diode includes a semiconductor body having a first side and a second side opposite the first side, a primary doped region of a first conductivity type at the first side of the semiconductor body, a primary doped region of a second conductivity type opposite the first conductivity type at the second side of the semiconductor body, an enhancement region of the second conductivity type below and adjoining the primary doped region of the first conductivity type, the enhancement region forming an active pn-junction with the primary doped region of the first conductivity type, and a collection region of the first conductivity type interposed between the enhancement region and the primary doped region of the second conductivity type and configured to transport a photocarrier generated in the collection region or the primary doped region of the second conductivity type towards the enhancement region.

19 Claims, 7 Drawing Sheets

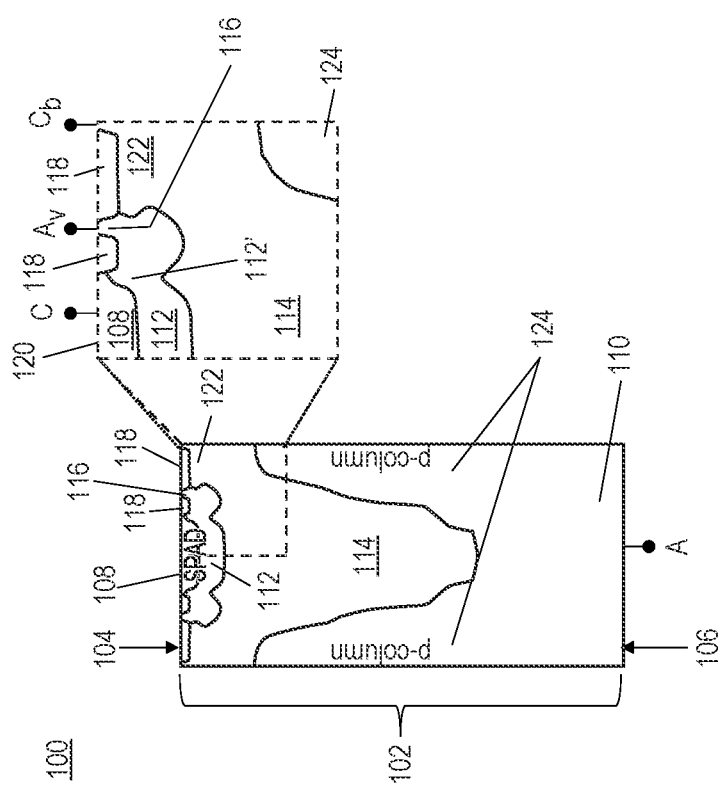
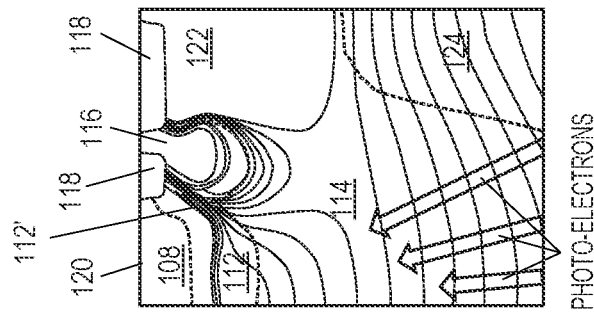
Figure 1A
Figure 1B

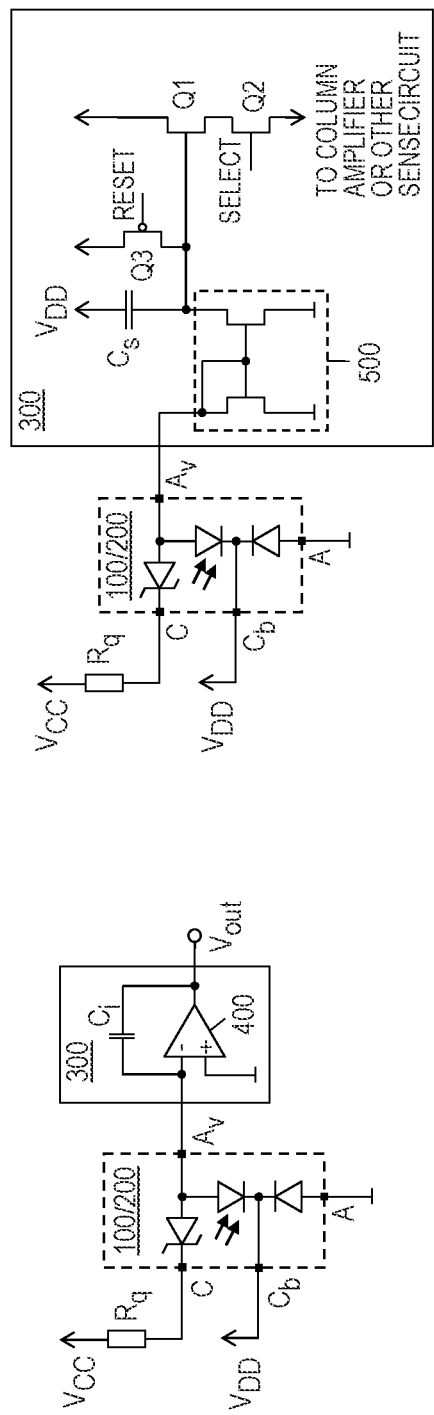

PHOTON AVALANCHE DIODE AND METHODS OF PRODUCING THEREOF

BACKGROUND

Single-photon avalanche diodes (SPADs) have high light detection sensitivity and gain, and allow very fast read-out. SPADs may be arranged in an array to form a silicon photo-multiplier and are used in applications such as LiDAR (light detection and ranging), proximity detection sensors, time-of-flight (ToF) cameras, scintillator read-out such as in positron emission tomography (PET), time-resolved luminescence read-out, gas sensing, bio molecule sensing, etc.

However, photon detection efficiency in the near infrared wavelength spectrum is poor for SPAD sensors fabricated in Si technology. Si has a large absorption depth at such wavelengths. As such, Si-based SPADs are typically used in green short wavelength range applications rarely at near infrared wavelength applications such as LiDAR at 905 nm, ToF at 850 nm or 940 nm, etc.

Another limitation for SPADs is compactness. A larger SPAD pitch (size) results in less dynamic range (larger dead-time and higher dark count rate) and lower spatial resolution. However, SPADs typically operate at high voltages which require an edge termination structure for proper isolation. Reducing the sensor size down to a pitch of about 5 μm or less results in significant loss in SPAD photon detection efficiency due to edge termination effects. A larger SPAD pitch (size) results in less sensitivity.

Thus, there is a need for an improved SPAD cell design and related methods of manufacture.

SUMMARY

According to an embodiment of a photon avalanche diode, the photon avalanche diode comprises: a semiconductor body having a first side and a second side opposite the first side; a primary doped region of a first conductivity type at the first side of the semiconductor body; a primary doped region of a second conductivity type opposite the first conductivity type at the second side of the semiconductor body; an enhancement region of the second conductivity type below and adjoining the primary doped region of the first conductivity type, the enhancement region forming an active pn-junction with the primary doped region of the first conductivity type; and a collection region of the first conductivity type interposed between the enhancement region and the primary doped region of the second conductivity type, and configured to transport a photocarrier generated in the collection region or the primary doped region of the second conductivity type towards the enhancement region.

According to another embodiment of a photon avalanche diode, the photon avalanche diode comprises: a semiconductor body; a first diode, a second diode and a third diode formed in the semiconductor body, the second diode being a photodiode; a main cathode terminal connected to the cathode of the first diode; a main anode terminal connected to the anode of the third diode; an auxiliary cathode terminal connected to the cathode of the third diode and to the cathode of the second diode; and an auxiliary anode terminal connected to the anode of the first diode and to the anode of the second diode, wherein the main anode terminal is electrically connected to ground or a reference potential, wherein the main cathode terminal is electrically connected to a voltage which causes a photocarrier multiplication region to form within the semiconductor body, wherein the auxiliary anode terminal is electrically connected to ground or to a read-out circuit, wherein the auxiliary cathode terminal is electrically connected to a constant bias voltage less than a voltage applied to the main cathode terminal.

According to an embodiment of a method of producing a photon avalanche diode, the method comprises: forming a primary doped region of a first conductivity type at a first side of a semiconductor body; forming a primary doped region of a second conductivity type opposite the first conductivity type at a second side of the semiconductor body opposite the first side; forming an enhancement region of the second conductivity type below and adjoining the primary doped region of the first conductivity type, the enhancement region forming an active pn-junction with the primary doped region of the first conductivity type; and forming a collection region of the first conductivity type interposed between the enhancement region and the primary doped region of the second conductivity type, and configured to transport a photocarrier generated in the collection region or the primary doped region of the second conductivity type towards the enhancement region.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A illustrates a partial cross-sectional view of an embodiment of a single-photon avalanche diode (SPAD).

FIG. 1B illustrates an electric field potential distribution within part of the SPAD shown in FIG. 1A.

FIGS. 4 through 7 illustrate respective circuit schematics of different embodiments of the read-out circuit shown in FIG. 3.

DETAILED DESCRIPTION

Figure 2B:
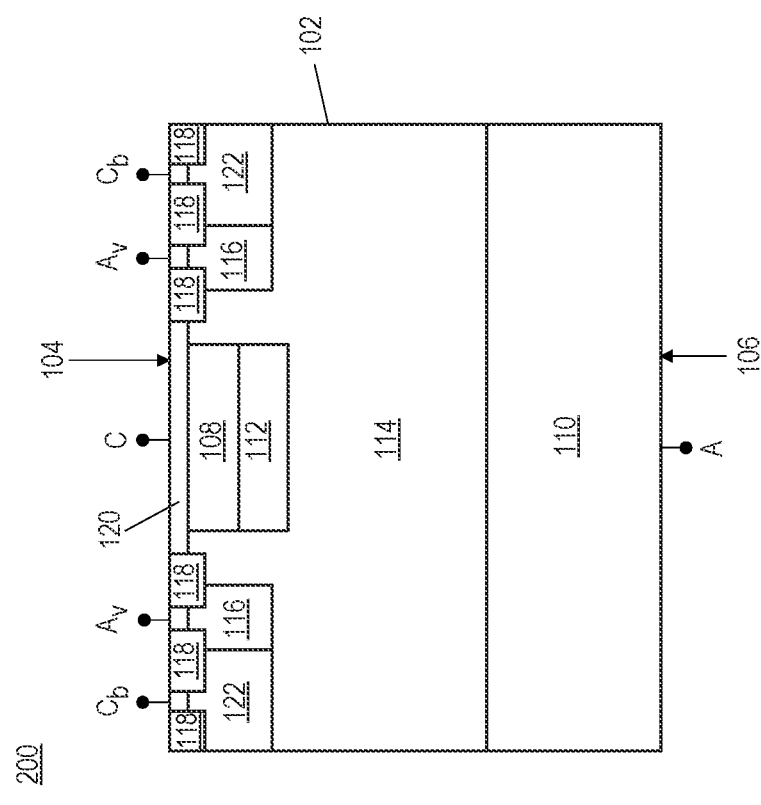
FIG. 2B illustrates a partial cross-sectional view of the SPAD in FIG. 2A, along the line labelled A-A'.

The embodiments described provide a single-photon avalanche diode (SPAD) having a collection region where photocarriers such as photoelectrons or photoholes are collected and directed to the multiplication region of the SPAD. The multiplication region, which is above the collection region and formed between one of the primary (cathode or anode) doped regions of the device and an enhancement region of the opposite conductivity type, includes a breakdown mechanism which causes multiplication to occur. The collection region directs photocarriers generated deeper in the SPAD structure upward toward the multiplication region, improving efficiency for longer wavelength light.

The SPAD may also include an auxiliary (virtual) doped region of the same conductivity type as the enhancement region and which forms a counter electrode to the primary doped region of the SPAD adjoining the enhancement region. The auxiliary doped region of the same conductivity type as the enhancement region is electrically isolated from the primary doped region of the SPAD adjoining the enhancement region, e.g., by an auxiliary doped region of the opposite conductivity type as the enhancement region and which is biased differently than the primary doped region adjoining the enhancement region. The potential of the auxiliary doped region of the same conductivity type as the enhancement region is not necessarily fixed. For example, the auxiliary doped region of the same conductivity type as the enhancement region may have a variable electric potential and be used as a readout terminal/electrode.

Described next in more detail are various embodiments of the SPAD cell design and methods of manufacturing the SPAD. In this context, the primary cathode region is shown at one side of the SPAD, the primary anode region at the opposite side of the SPAD, the enhancement region adjoining the primary cathode region, and the collection region separating the enhancement region and the primary cathode region from the primary anode region. However, the position of the primary cathode and primary anode regions may be switched/reversed. That is, the enhancement region may instead adjoin the primary anode region at one side of the SPAD, and the collection region may instead separate the enhancement region and the primary anode region from the primary cathode region. Accordingly, the phrase "a primary doped region of a first conductivity type" may refer to either the primary cathode region or the primary anode region, depending on the position of the primary cathode and anode regions, and the phrase "a primary doped region of a second conductivity type" refers to the other primary doped region of the device (anode/cathode).

FIG. 1A illustrates a partial cross-sectional view of an embodiment of a SPAD 100. The SPAD 100 includes a semiconductor body 102 having a first side 104 and a second side 106 opposite the first side 104. A primary cathode (C) region 108 of a first conductivity type is formed at the first side 104 of the semiconductor body 102. A primary anode (A) region 110 of a second conductivity type opposite the first conductivity type is formed at the second side 106 of the semiconductor body 102. In one embodiment, the semiconductor body 102 is a Si body, the first conductivity type is n-type, and the second conductivity type is p-type. The Si body 102 may include a base Si substrate and one or more epitaxial layers grown on the base Si substrate. Other types of semiconductor material may be used for the semiconductor body 102.

An enhancement region 112 of the second conductivity type (e.g. p-type) is formed below and adjoining the primary cathode region 108. A collection region 114 of the first conductivity type (e.g. n-type) is interposed between the enhancement region 112 and the primary anode region 110.

The collection region 114 is more weakly doped than the primary cathode region 108, the primary anode region 110, and the enhancement region 112. The collection region 114 is configured to transport a photocarrier generated in the collection region 114 or the primary anode region 110 towards the enhancement region 112. The photocarrier is a photoelectron in the case of an n-type collection region 114 and a photohole in the case of a p-type collection region 114. The enhancement region 112 forms an active pn-junction with the primary cathode region 108. FIG. 1A includes an enlarged view of part of the SPAD 100 that includes primary cathode region 108, the enhancement region 112 and the collection region 114.

The SPAD 100 may also include an auxiliary anode ($A_v$) region 116 of the second conductivity type at the first side 104 of the semiconductor body 102. The auxiliary anode region 116 is also referred to herein as a virtual anode region because the SPAD 100 already includes the primary anode region 110 at the second side 106 of the semiconductor body 102 and which is typically connected to ground. The auxiliary anode region 116 is more heavily doped than the enhancement region 112 and laterally spaced apart from the primary cathode region 108. For example, the SPAD 100 may include a dielectric isolation 118 such as a shallow trench isolation (STI) structure laterally interposed between the primary cathode region 108 and the auxiliary anode region 116 at the first side 104 of the semiconductor body 102. According to this example, the enhancement region 112 may laterally extend to the auxiliary anode region 116 and the doping concentration of the enhancement region 112 may decrease in a region 112' of the enhancement region 112 which is adjacent to where the dielectric isolation 118 meets the primary cathode region 108, to prevent a high electric field near the dielectric isolation 118. That is, the primary cathode region 108 of the first conductivity type may stop at the edge of the dielectric isolation 118 and the dielectric isolation 118 may adjoin a relatively weakly doped region 112' of the second conductivity type. The primary cathode region 108 may include a highly doped surface region 120 to prevent depletion at the first side 104 of the semiconductor body 102.

Further according to the embodiment illustrated in FIG. 1A, the auxiliary anode region 116 is vertically separated from the primary anode region 110 by the collection region 114. The auxiliary anode region 116, if provided, may have a variable electric potential and be used as a readout terminal/electrode as described in more detail later herein. The auxiliary anode region 116 instead may be omitted.

During operation of the SPAD 100, the primary cathode region 108 is biased at a voltage, e.g., about 20V and which results in a high electric field between the primary cathode region 108 and the enhancement region 112 of the opposite conductivity type. This high electric field defines a multiplication region between the primary cathode region 108 and the enhancement region 112 and which is configured to cause avalanche multiplication when a single electron enters the high field multiplication region. This is commonly referred to as Geiger mode of operation. The biasing of the primary cathode region 108 also causes full depletion of the enhancement region 112, via the multiplication region, so that an attractive potential is created for electrons located in the underlying collection region 114.

A photon absorbed in the collection region 114 or in the underlying primary anode region 110 creates an electron-hole pair, wherein the electron is also referred to herein as photoelectron and the hole as photohole. In the case of an n-type collection region 114, a photoelectron is transported by the collection region 114 towards the multiplication region and initiates avalanche breakdown, whereas the photohole is transported to the primary anode region 110. Avalanche electrons and avalanche holes are created in the multiplication region when avalanche breakdown occurs, rapidly discharging the junction capacitance between the primary cathode region 108 and the enhancement region 112. Due to the applied voltages of the SPAD 100, the avalanche electrons are transported to the primary cathode region 108 and the avalanche holes are transported to the (virtual) auxiliary anode region 116, if provided, and which results in a current flowing through an external supply network (not shown in FIG. 1A). In the case of an p-type collection region 114, a photohole is instead transported by the collection region 114 towards the multiplication region to initiate avalanche breakdown.

The resulting current causes a voltage drop over a quenching resistor Rq (not shown in FIG. 1A), reducing the voltage drop between the primary cathode region 108 and the primary anode region 110, or the auxiliary anode 116, if provided, and thus quenching the avalanche process. The junction capacitance is then recharged to the initial condition through the quenching resistor, to enable a subsequent avalanche process. The quenching resistor may be located at the cathode side of the SPAD 100 or the (virtual) auxiliary anode side, if provided. Also, active devices may be used to control the quenching and recharging process, as described in more detail later herein.

The signal is also visible at the auxiliary anode region 116, if provided, because recharging of the junction capacitance takes place by a current flowing from the primary cathode region 108 to the auxiliary anode region 116. Accordingly, the current can be seen at the auxiliary anode region 116. The signal present at the auxiliary anode region 116 can be read out at a relatively small voltage and therefore high-voltage circuitry is not needed to read the signal. The current flowing into the auxiliary anode region 116 may be detected, for example, by a charge-integrating circuit or a transimpedance amplifier. The potential variation present at the auxiliary anode region 116 may be used to directly control, e.g., CMOS gates to create a digital output pulse signal.

If the auxiliary anode region 116 is included in the SPAD 100, the SPAD 100 may also include an auxiliary cathode ($C_b$) region 122 of the first conductivity type at the first side 104 of the semiconductor body 102. The auxiliary anode region 116 is laterally interposed between the auxiliary cathode region 122 and the primary cathode region 108 at the first side 104 of the semiconductor body 102, e.g., as shown in FIG. 1A.

The auxiliary cathode region 122 is connected to the collection region 114 at the edge of the SPAD cell, establishing an extra depletion zone and providing the electric field potential distribution shown in FIG. 1B. The auxiliary cathode region 122 also isolates the auxiliary anode region 116 from the primary anode region 110 of the SPAD 100. For example, the auxiliary anode region 116 may be electrically connected to ground or to a read-out circuit (not shown in FIG. 1A). The auxiliary cathode region 122 may be electrically connected to a constant bias voltage, e.g., in the single volt range and which depletes the collection region 114 such that the auxiliary anode region 116 is electrically isolated from the primary anode region 110. For example, the auxiliary cathode region 122 may be electrically connected to a fixed voltage such as the supply voltage of a CMOS chip.

The SPAD 100 may also include columnar regions 124 of the second conductivity type and which vertically extend from the primary anode region 110 and laterally confine the collection region 114 below the enhancement region 112. The auxiliary anode region 116, if provided, is electrically isolated from the columnar regions 124 of the second conductivity type by the collection region 114 in FIG. 1A. The columnar regions 124 of the second conductivity type impart curvature to equipotential lines within the SPAD 100, based on the work function difference between n-type and p-type semiconductor material and the doping concentration in the columnar regions 124. The columnar regions 124 of the second conductivity type thus aid in directing photoelectrons or photoholes (depending on the conductivity types) toward the center of the SPAD 100, allowing for a smaller multiplication region. The edge termination region, which may be the region laterally extending outside the multiplication region, may remain the same size whereas the multiplication region may be made smaller and therefore provide a smaller SPAD cell pitch. In one embodiment, the auxiliary anode region 116 and the auxiliary cathode region 122 are part of the edge termination.

As explained above, the position of the primary cathode and primary anode regions 108, 110 of the SPAD 100 in FIGS. 1A-1B may be switched/reversed so that the primary cathode region 108 is disposed at the second side 106 of the semiconductor body 102 and the primary anode region 110 is disposed at the first side 104 of the semiconductor body 102. The position of the enhancement region 112, the collection region 114, the auxiliary anode region 116, and the auxiliary cathode region 122 remain the same in either configuration (primary cathode region 108 at the first side 104 and primary anode region 110 at the second side 106, or primary anode region 110 at the first side 104 and primary cathode region 108 at the second side 106). The auxiliary anode region 116 is also referred to herein as auxiliary doped region of the second conductivity type. The auxiliary cathode region 122 is also referred to herein as auxiliary doped region of the first conductivity type.

Figure 2A:
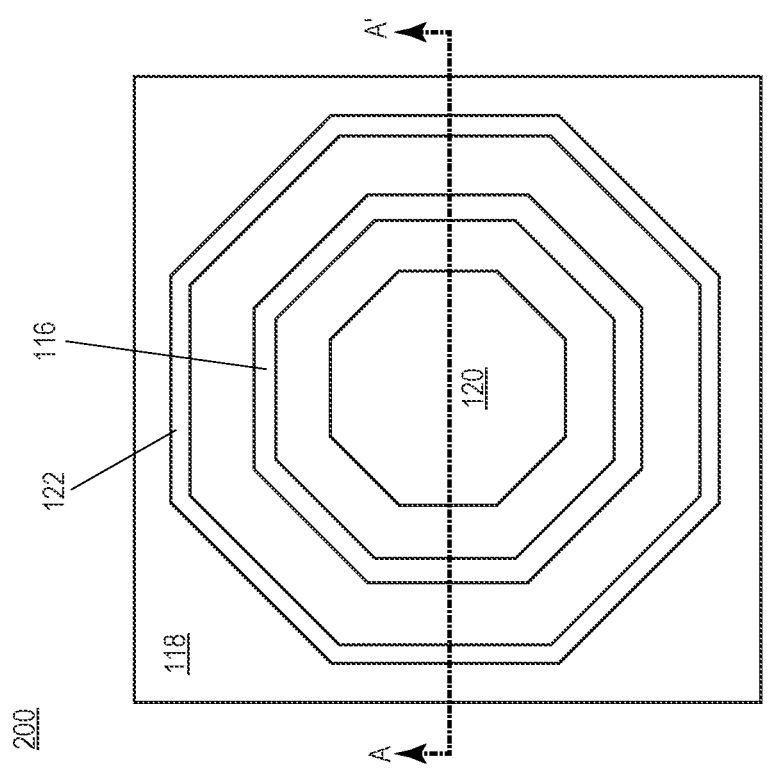
FIG. 2A illustrates a partial plan view of another embodiment of a SPAD.

FIGS. 2A and 2B illustrate another embodiment of a SPAD 200. FIG. 2A is a partial plan view of the SPAD 200, and FIG. 2B is a partial cross-sectional view of the SPAD 200. The cross-section of FIG. 2B is taken along the line labelled A-A' in FIG. 2A. The SPAD 200 may have a concentric layout as shown in FIG. 2A, in that the primary cathode region 108 is laterally surrounded by the auxiliary anode region 116 which in turn is laterally surrounded by the auxiliary cathode region 122 in a series of concentric ring-like structures. However, this is just one example. The SPAD 200 may instead have a different layout.

The embodiment illustrated in FIGS. 2A and 2B is similar to the embodiment illustrated in FIG. 1A. Different, however, the columnar regions 124 of the second conductivity type shown in FIG. 1A are omitted from the SPAD 200 shown in FIGS. 2A and 2B. Also in FIGS. 2A and 2B, the collection region 114 laterally separates the primary cathode region 108 from the auxiliary anode region 116, if provided, at the first side 104 of the semiconductor body 102. According to this embodiment, the enhancement region 112 does not laterally extend to the auxiliary anode region 116. Instead, the collection region 114 laterally separates the enhancement region 112 from the auxiliary anode region 116 in this embodiment.

As explained above, the position of the primary cathode and primary anode regions 108, 110 of the SPAD 200 in FIGS. 2A-2B may be switched/reversed so that the primary cathode region 108 is disposed at the second side 106 of the semiconductor body 102 and the primary anode region 110 is disposed at the first side 104 of the semiconductor body 102. The position of the enhancement region 112, the collection region 114, the auxiliary anode region 116, and the auxiliary cathode region 122 remain the same in either configuration (primary cathode region 108 at the first side 104 and primary anode region 110 at the second side 106, or primary anode region 110 at the first side 104 and primary cathode region 108 at the second side 106).

Figure 3:
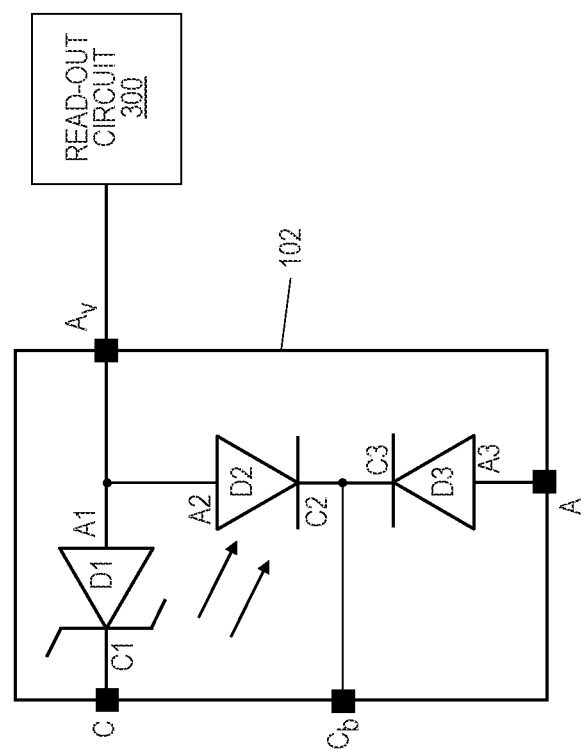
FIG. 3 illustrates a circuit schematic of the SPADs illustrated in FIGS. 1 and 2A-2B with a read-out circuit.

FIG. 3 illustrates a circuit schematic of the SPADs 100, 200 illustrated in FIGS. 1 and 2A-2B. Each SPAD 100, 200 includes a first diode D1, a second diode D2 and a third diode D3 formed in a semiconductor body 102 which is schematically illustrated in FIG. 3. The second diode D2 is a photodiode. The first diode D1 and the third diode D3 may be p-n junction diodes, respectively.

Each SPAD 100, 200 also includes a main cathode terminal C connected to the cathode C1 of the first diode D1, a main anode terminal A connected to the anode A3 of the third diode D3, an auxiliary cathode terminal $C_b$ connected to the cathode C3 of the third diode D3 and to the cathode C2 of the second diode D2, and an auxiliary anode terminal $A_v$ connected to the anode A1 of the first diode D1 and to the anode A2 of the second diode D2. The main anode terminal A is electrically connected to ground or a reference potential. The main cathode terminal C is electrically connected to a voltage which causes a photoelectron multiplication region to form within the semiconductor body 102. The auxiliary anode terminal $A_v$ is electrically connected to ground or to a read-out circuit. The auxiliary cathode terminal $C_b$ is electrically connected to a constant bias voltage less than the voltage applied to the main cathode terminal C.

Under these biasing conditions, a photoelectron initiates avalanche breakdown within a multiplication region of the SPAD 100, 200. The resulting avalanche electrons are transported to the main cathode terminal C and the resulting avalanche holes are transported to the auxiliary anode terminal $A_v$. A read-out circuit 300 may be electrically connected to the auxiliary anode terminal $A_v$, the read-out circuit 300 being configured to detect current flowing from the primary cathode region 108 to the auxiliary anode region 110 of the SPAD 100, 200 during recharging of the junction capacitance between the enhancement region 112 and the primary cathode region 108 after an avalanche event. The read-out circuit 300 may be integrated in the same die (chip) as the SPAD 100, 200 or may be formed in a separate die. Described next are various embodiments of the read-out circuit 300.

FIG. 4 illustrates an embodiment of the read-out circuit 300. According to this embodiment, passive quenching is applied to the primary cathode region 108 of the SPAD 100, 200 via a quenching resistor $R_q$ connected between the main cathode terminal C of the SPAD 100, 200 and a voltage supply $V_{CC}$ for biasing the primary cathode region 108. A lower bias voltage VDD is applied to the auxiliary cathode terminal $C_b$ of the SPAD 100, 200 for biasing the auxiliary cathode region 122 of the SPAD 100, 200. The read-out circuit 300 is a charge-integrating circuit in FIG. 4, where the charge-integrating circuit includes an operational amplifier 400 and a capacitor Ci coupled across the negative input terminal and the output terminal of the operational amplifier 400. The charge-integrating circuit converts a current pulse that emerges at the auxiliary anode terminal $A_v$ of the SPAD 100, 200 to a voltage $V_{out}$ which can be read out. The charge-integrating circuit instead may be implemented as a transimpedance amplifier, e.g., by replacing capacitor $C_i$ with a resistor.

FIG. 5 illustrates another embodiment of the read-out circuit 300. The embodiment shown in FIG. 5 is similar to the embodiment shown in FIG. 4 in that passive quenching is applied to the primary cathode region 108 of the SPAD 100, 200 via a quenching resistor $R_q$ connected between the main cathode terminal C of the SPAD 100, 200 and voltage supply $V_{CC}$. Different, however, the charge-integrating circuit of the read-out circuit 300 includes a current mirror 500 for mirroring a current pulse that emerges at the auxiliary anode terminal $A_v$ of the SPAD 100, 200. A capacitor $C_s$ is charged to a level which corresponds to the mirrored current. A readout circuit formed by transistors Q1, Q2 senses the voltage across the capacitor $C_s$ when a 'select' signal is active. The sensed capacitor voltage may be sensed/detected by a column amplifier similar to a memory cell readout operation, or may be sensed/detected by another type of sensing circuit. The capacitor $C_s$ is discharged by transistor Q3 responsive to a 'reset' signal.

Figure 6:
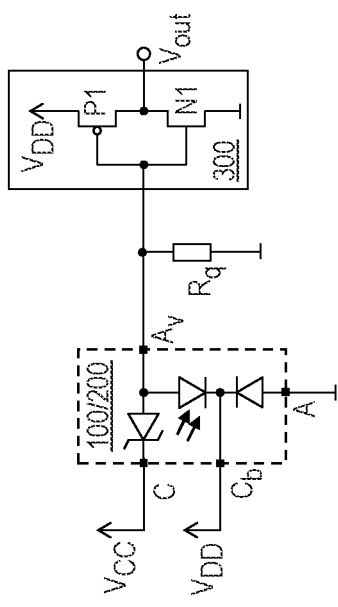

FIG. 6 illustrates another embodiment of the read-out circuit 300. According to this embodiment, passive quenching is applied to the auxiliary anode region 116 of the SPAD 100, 200 via a quenching resistor $R_q$ connected to the auxiliary anode terminal $A_v$ of the SPAD 100, 200. The read-out circuit 300 includes a pMOS device P1 coupled in series with an nMOS device N1 to form a digital pulse output Vout which corresponds to a current pulse that emerges at the auxiliary anode terminal $A_v$ of the SPAD 100, 200.

Figure 7:
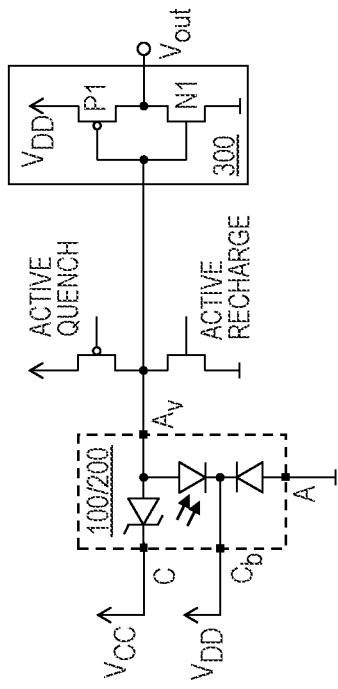

FIG. 7 illustrates another embodiment of the read-out circuit 300. According to this embodiment, active quenching is applied to the auxiliary anode region 116 of the SPAD 100, 200. For example, a pMOS device P2 may provide active quenching when switched on by signal 'active quench' and an nMOS device N2 may provide active recharging when switched on by signal 'active recharge.' The pMOS device P2 and the nMOS device N2 are coupled together at a common node which is also coupled to the auxiliary anode terminal $A_v$ of the SPAD 100, 200. The read-out circuit 300 in FIG. 7 is the same as in FIG. 6, and provides a digital pulse output Vout corresponding to a current pulse that emerges at the auxiliary anode terminal $A_v$ of the SPAD 100, 200.

Figure 8A:
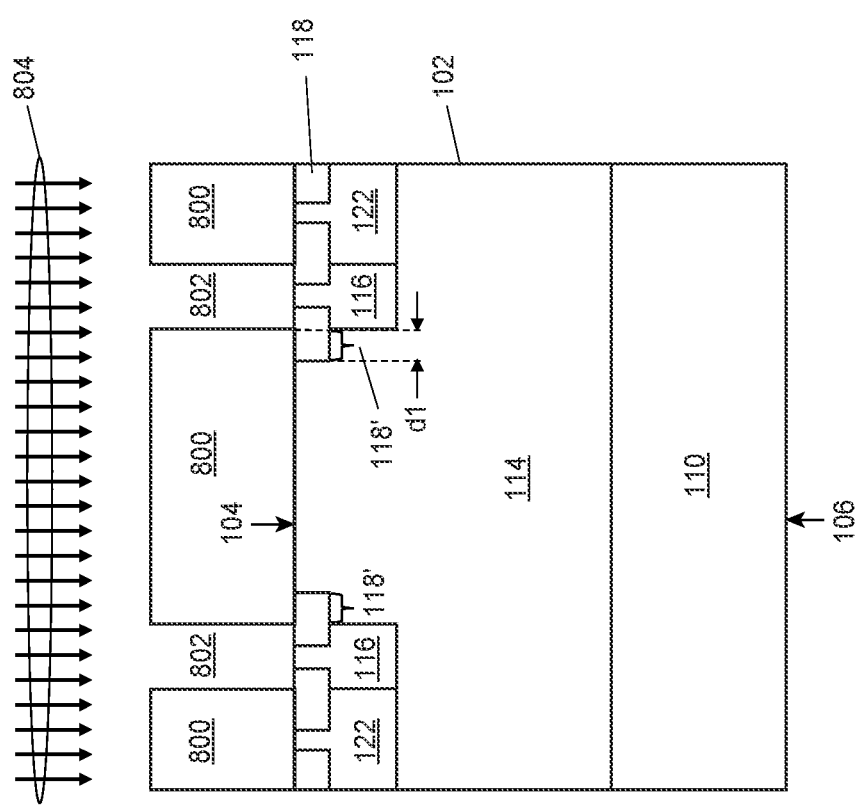
FIGS. 8A and 8B illustrate partial cross-sectional views of an embodiment of producing the SPAD shown in FIGS. 2A and 2B.
Figure 8B:
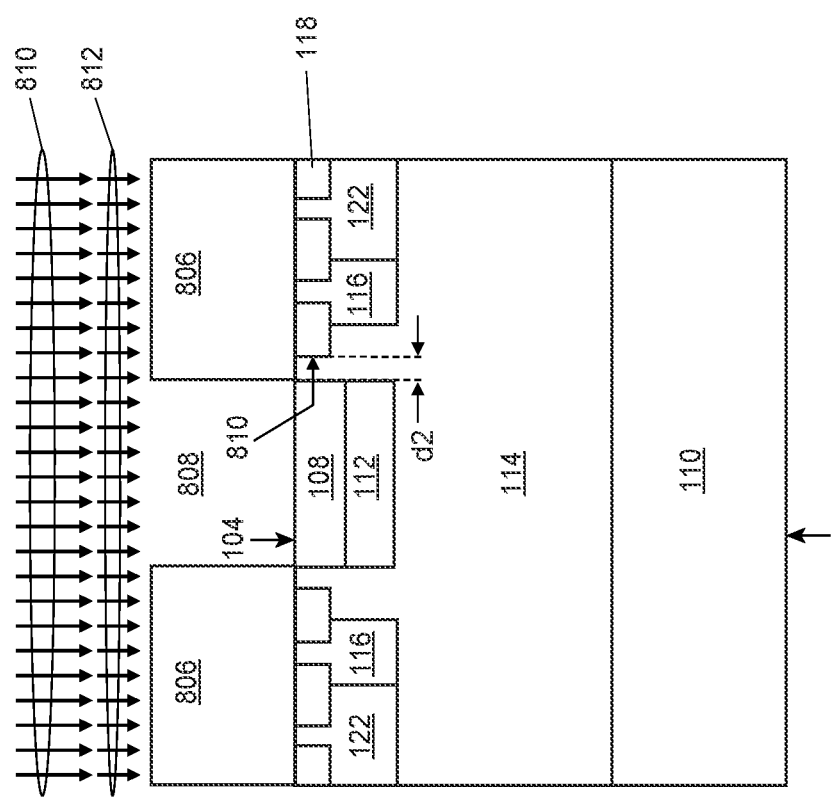

FIGS. 8A and 8B illustrate partial cross-sectional views of an embodiment of producing the SPAD 200 shown in FIGS. 2A and 2B.

In FIG. 8A, a first mask 800 with an opening 802 that defines the auxiliary anode region 116 of the SPAD 200 is formed on the first side 104 of the semiconductor body 102. The opening 802 in the first mask 800 partially overlaps with the dielectric isolation 118 by a distance 'd1' so that an inward part 118' of the dielectric isolation 118 remains covered by the first mask 800. In one embodiment, the first mask 800 is a photoresist. Dopants 804 of the second conductivity type are then implanted into the first side 104 of the semiconductor body 102 through the opening 802 in the first mask 800 to form the auxiliary anode region 116 of the SPAD 200. Implant energy, implant dose and parameters of a subsequent anneal determine the profile of the auxiliary anode region 116.

In FIG. 8B, a second mask 806 having an opening 808 which has no overlap with the dielectric isolation 118 is formed on the first side 104 of the semiconductor body 102. Accordingly, the second mask 806 laterally extends inward beyond an edge 810 of the dielectric isolation 118 by a distance 'd2'. In one embodiment, the second mask 806 is a photoresist. Dopants 810 of the second conductivity type and dopants 812 of the first conductivity type are then implanted into the first side 104 of the semiconductor body 102 through the opening 808 in the second mask 806 to form the enhancement region 112 and the primary cathode region 108, respectively, of the SPAD 200. Implant energy, implant dose and parameters of a subsequent anneal determine the profile of the enhancement region 112 and the primary cathode region 108, respectively.

Although the present disclosure is not so limited, the following numbered examples demonstrate one or more aspects of the disclosure.

Example 1. A photon avalanche diode, comprising: a semiconductor body having a first side and a second side opposite the first side; a primary doped region of a first conductivity type at the first side of the semiconductor body;

a primary doped region of a second conductivity type opposite the first conductivity type at the second side of the semiconductor body; an enhancement region of the second conductivity type below and adjoining the primary doped region of the first conductivity type, the enhancement region forming an active pn-junction with the primary doped region of the first conductivity type; and a collection region of the first conductivity type interposed between the enhancement region and the primary doped region of the second conductivity type, and configured to transport a photocarrier generated in the collection region or the primary doped region of the second conductivity type towards the enhancement region.

Example 2. The photon avalanche diode of example 1, wherein the semiconductor body is a Si body, wherein the first conductivity type is n-type, wherein the second conductivity type is p-type, wherein the primary doped region of the first conductivity type is a primary cathode region of the photon avalanche diode, and wherein the primary doped region of the second conductivity type is a primary anode region of the photon avalanche diode.

Example 3. The photon avalanche diode of examples 1 or 2, further comprising: an auxiliary doped region of the second conductivity type at the first side of the semiconductor body and laterally spaced apart from the primary doped region of the first conductivity type, wherein the auxiliary doped region of the second conductivity type is vertically separated from the primary doped region of the second conductivity type by the collection region.

Example 4. The photon avalanche diode of example 3, further comprising: an auxiliary doped region of the first conductivity type at the first side of the semiconductor body, wherein the auxiliary doped region of the second conductivity type is laterally interposed between the auxiliary doped region of the first conductivity type and the primary doped region of the first conductivity type at the first side of the semiconductor body.

Example 5. The photon avalanche diode of example 4, wherein the auxiliary doped region of the second conductivity type is electrically connected to ground or to a read-out circuit, wherein the auxiliary doped region of the first conductivity type is electrically connected to a constant bias voltage which depletes the collection region such that the auxiliary doped region of the second conductivity type is electrically isolated from the primary doped region of the second conductivity type, wherein the primary doped region of the first conductivity type is electrically connected to a voltage which causes a high electric field multiplication region to form between the primary doped region of the first conductivity type and the enhancement region, and wherein the multiplication region is configured to fully deplete the enhancement region and to enter avalanche multiplication when a single electron enters the multiplication region.

Example 6. The photon avalanche diode of any of examples 3 through 5, further comprising a read-out circuit electrically connected to the auxiliary doped region of the second conductivity type and configured to detect current flowing from the primary doped region of the first conductivity type to the auxiliary doped region of the second conductivity type during recharging of a junction capacitance between the enhancement region and the primary doped region of the first conductivity type after an avalanche event.

Example 7. The photon avalanche diode of example 6, wherein passive quenching is applied to the primary doped region of the first conductivity type, and wherein the read-out circuit comprises a charge-integrating circuit or a transimpedance amplifier.

Example 8. The photon avalanche diode of example 6, wherein active or passive quenching is applied to the auxiliary doped region of the second conductivity type, and wherein the read-out circuit has a digital pulse output.

Example 9. The photon avalanche diode of any of examples 3 through 8, wherein the auxiliary doped region of the second conductivity type has a variable electric potential.

Example 10. The photon avalanche diode of any of examples 3 through 9, further comprising: columnar regions of the second conductivity type and which vertically extend from the primary doped region of the second conductivity type and laterally confine the collection region below the enhancement region, wherein the auxiliary doped region of the second conductivity type is electrically isolated from the columnar regions.

Example 11. The photon avalanche diode of any of examples 3 through 10, further comprising: dielectric isolation between the primary doped region of the first conductivity type and the auxiliary doped region of the second conductivity type at the first side of the semiconductor body, wherein a doping concentration of the enhancement region decreases in a region of the enhancement region which is adjacent to where the dielectric isolation meets the primary doped region of the first conductivity type. The enhancement region may or may not laterally extend to the auxiliary doped region of the second conductivity type in this example.

Example 12. A photon avalanche diode, comprising: a semiconductor body; a first diode, a second diode and a third diode formed in the semiconductor body, the second diode being a photodiode; a main cathode terminal connected to the cathode of the first diode; a main anode terminal connected to the anode of the third diode; an auxiliary cathode terminal connected to the cathode of the third diode and to the cathode of the second diode; and an auxiliary anode terminal connected to the anode of the first diode and to the anode of the second diode, wherein the main anode terminal is electrically connected to ground or a reference potential, wherein the main cathode terminal is electrically connected to a voltage which causes a photocarrier multiplication region to form within the semiconductor body, wherein the auxiliary anode terminal is electrically connected to ground or to a read-out circuit, wherein the auxiliary cathode terminal is electrically connected to a constant bias voltage less than a voltage applied to the main cathode terminal.

Example 13. The photon avalanche diode of example 12, further comprising a read-out circuit electrically connected to the auxiliary anode terminal.

Example 14. The photon avalanche diode of example 13, wherein passive quenching is applied to the main cathode terminal, and wherein the read-out circuit comprises a charge-integrating circuit or a transimpedance amplifier.

Example 15. The photon avalanche diode of example 13, wherein active or passive quenching is applied to the auxiliary anode terminal, and wherein the read-out circuit has a digital pulse output.

Example 16. A method of producing a photon avalanche diode, the method comprising: forming a primary doped region of a first conductivity type at a first side of a semiconductor body; forming a primary doped region of a second conductivity type opposite the first conductivity type at a second side of the semiconductor body opposite the first side; forming an enhancement region of the second conductivity type below and adjoining the primary doped region of the first conductivity type, the enhancement region forming an active pn-junction with the primary doped region of the first conductivity type; and forming a collection region of the first conductivity type interposed between the enhancement region and the primary doped region of the second conductivity type, and configured to transport a photocarrier generated in the collection region or the primary doped region of the second conductivity type towards the enhancement region.

Example 17. The method of example 16, wherein the semiconductor body is a Si body, wherein the first conductivity type is n-type, wherein the second conductivity type is p-type, wherein the primary doped region of the first conductivity type is a primary cathode region of the photon avalanche diode, and wherein the primary doped region of the second conductivity type is a primary anode region of the photon avalanche diode.

Example 18. The method of example 16 or 17, further comprising: forming an auxiliary doped region of the second conductivity type at the first side of the semiconductor body and laterally spaced apart from the primary doped region of the first conductivity type, wherein the auxiliary doped region of the second conductivity type is vertically separated from the primary doped region of the second conductivity type by the collection region.

Example 19. The method of example 18, further comprising: forming an auxiliary doped region of the first conductivity type at the first side of the semiconductor body, wherein the auxiliary doped region of the second conductivity type is laterally interposed between the auxiliary doped region of the first conductivity type and the primary doped region of the first conductivity type at the first side of the semiconductor body.

Example 20. The method of example 18 or 19, further comprising: forming columnar regions of the second conductivity type and which vertically extend from the primary doped region of the second conductivity type and laterally confine the collection region below the enhancement region, wherein the auxiliary doped region of the second conductivity type is electrically isolated from the columnar regions.

Example 21. The method of any of examples 18 through 20, further comprising: forming a dielectric isolation between the primary doped region of the first conductivity type and the auxiliary doped region of the second conductivity type at the first side of the semiconductor body, wherein a doping concentration of the enhancement region decreases in a region of the enhancement region which is adjacent to where the dielectric isolation meets the primary doped region of the first conductivity type. The enhancement region may or may not laterally extend to the auxiliary doped region of the second conductivity type in this example.

Example 22. The method of example 21, wherein forming the auxiliary doped region of the second conductivity type comprises: forming a photoresist on the first side of the semiconductor body, the photoresist having an opening which partially overlaps with the dielectric isolation so that an inward part of the dielectric isolation remains covered by the photoresist; and implanting dopants of the second conductivity type into the first side of the semiconductor body through the opening in the photoresist.

Example 23. The method of examples 21 or 22, wherein forming the primary doped region of the first conductivity type and the enhancement region comprises: forming a photoresist on the first side of the semiconductor body, the photoresist having an opening which has no overlap with the dielectric isolation so that the photoresist laterally extends inward beyond an edge of the dielectric isolation; and implanting dopants of the second conductivity type and dopants of the first conductivity type into the first side of the semiconductor body through the opening in the photoresist.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A photon avalanche diode, comprising:
   a semiconductor body having a first side and a second side opposite the first side;
   a primary doped region of a first conductivity type at the first side of the semiconductor body;
   a primary doped region of a second conductivity type opposite the first conductivity type at the second side of the semiconductor body;
   an enhancement region of the second conductivity type below and adjoining the primary doped region of the first conductivity type, the enhancement region forming an active pn-junction with the primary doped region of the first conductivity type; and
   a collection region of the first conductivity type interposed between the enhancement region and the primary doped region of the second conductivity type, and configured to transport a photocarrier generated in the collection region or the primary doped region of the second conductivity type towards the enhancement region.

2. The photon avalanche diode of claim 1, wherein the semiconductor body is a Si body, wherein the first conductivity type is n-type, wherein the second conductivity type is p-type, wherein the primary doped region of the first conductivity type is a primary cathode region of the photon avalanche diode, and wherein the primary doped region of the second conductivity type is a primary anode region of the photon avalanche diode.

3. The photon avalanche diode of claim 1, further comprising:
   an auxiliary doped region of the second conductivity type at the first side of the semiconductor body and laterally spaced apart from the primary doped region of the first conductivity type, wherein the auxiliary doped region of the second conductivity type is vertically separated from the primary doped region of the second conductivity type by the collection region.

4. The photon avalanche diode of claim 3, further comprising:
an auxiliary doped region of the first conductivity type at the first side of the semiconductor body,
wherein the auxiliary doped region of the second conductivity type is laterally interposed between the auxiliary doped region of the first conductivity type and the primary doped region of the first conductivity type at the first side of the semiconductor body.

5. The photon avalanche diode of claim 4, wherein the auxiliary doped region of the second conductivity type is electrically connected to ground or to a read-out circuit, wherein the auxiliary doped region of the first conductivity type is electrically connected to a constant bias voltage which depletes the collection region such that the auxiliary doped region of the second conductivity type is electrically isolated from the primary doped region of the second conductivity type, wherein the primary doped region of the first conductivity type is electrically connected to a voltage which causes a high electric field multiplication region to form between the primary doped region of the first conductivity type and the enhancement region, and wherein the multiplication region is configured to fully deplete the enhancement region and to enter avalanche multiplication when a single electron enters the multiplication region.

6. The photon avalanche diode of claim 3, further comprising a read-out circuit electrically connected to the auxiliary doped region of the second conductivity type and configured to detect current flowing from the primary doped region of the first conductivity type to the auxiliary doped region of the second conductivity type during recharging of a junction capacitance between the enhancement region and the primary doped region of the first conductivity type after an avalanche event.

7. The photon avalanche diode of claim 6, wherein passive quenching is applied to the primary doped region of the first conductivity type, and wherein the read-out circuit comprises a charge-integrating circuit or a transimpedance amplifier.

8. The photon avalanche diode of claim 6, wherein active or passive quenching is applied to the auxiliary doped region of the second conductivity type, and wherein the read-out circuit has a digital pulse output.

9. The photon avalanche diode of claim 3, wherein the auxiliary doped region of the second conductivity type has a variable electric potential.

10. The photon avalanche diode of claim 3, further comprising:
columnar regions of the second conductivity type and which vertically extend from the primary doped region of the second conductivity type and laterally confine the collection region below the enhancement region,
wherein the auxiliary doped region of the second conductivity type is electrically isolated from the columnar regions.

11. The photon avalanche diode of claim 3, further comprising:
dielectric isolation between the primary doped region of the first conductivity type and the auxiliary doped region of the second conductivity type at the first side of the semiconductor body,
wherein a doping concentration of the enhancement region decreases in a region of the enhancement region which is adjacent to where the dielectric isolation meets the primary doped region of the first conductivity type.

12. A method of producing a photon avalanche diode, the method comprising:
forming a primary doped region of a first conductivity type at a first side of a semiconductor body;
forming a primary doped region of a second conductivity type opposite the first conductivity type at a second side of the semiconductor body opposite the first side;
forming an enhancement region of the second conductivity type below and adjoining the primary doped region of the first conductivity type, the enhancement region forming an active pn-junction with the primary doped region of the first conductivity type; and
forming a collection region of the first conductivity type interposed between the enhancement region and the primary doped region of the second conductivity type, and configured to transport a photocarrier generated in the collection region or the primary doped region of the second conductivity type towards the enhancement region.

13. The method of claim 12, wherein the semiconductor body is a Si body, wherein the first conductivity type is n-type, wherein the second conductivity type is p-type, wherein the primary doped region of the first conductivity type is a primary cathode region of the photon avalanche diode, and wherein the primary doped region of the second conductivity type is a primary anode region of the photon avalanche diode.

14. The method of claim 12, further comprising:
forming an auxiliary doped region of the second conductivity type at the first side of the semiconductor body and laterally spaced apart from the primary doped region of the first conductivity type,
wherein the auxiliary doped region of the second conductivity type is vertically separated from the primary doped region of the second conductivity type by the collection region.

15. The method of claim 14, further comprising:
forming an auxiliary doped region of the first conductivity type at the first side of the semiconductor body,
wherein the auxiliary doped region of the second conductivity type is laterally interposed between the auxiliary doped region of the first conductivity type and the primary doped region of the first conductivity type at the first side of the semiconductor body.

16. The method of claim 14, further comprising:
forming columnar regions of the second conductivity type and which vertically extend from the primary doped region of the second conductivity type and laterally confine the collection region below the enhancement region,
wherein the auxiliary doped region of the second conductivity type is electrically isolated from the columnar regions.

17. The method of claim 14, further comprising:
forming a dielectric isolation between the primary doped region of the first conductivity type and the auxiliary doped region of the second conductivity type at the first side of the semiconductor body,
wherein a doping concentration of the enhancement region decreases in a region of the enhancement region which is adjacent to where the dielectric isolation meets the primary doped region of the first conductivity type.

18. The method of claim 17, wherein forming the auxiliary doped region of the second conductivity type comprises:

forming a photoresist on the first side of the semiconductor body, the photoresist having an opening which partially overlaps with the dielectric isolation so that an inward part of the dielectric isolation remains covered by the photoresist; and implanting dopants of the second conductivity type into the first side of the semiconductor body through the opening in the photoresist.

19. The method of claim 17, wherein forming the primary doped region of the first conductivity type and the enhancement region comprises:

forming a photoresist on the first side of the semiconductor body, the photoresist having an opening which has no overlap with the dielectric isolation so that the photoresist laterally extends inward beyond an edge of the dielectric isolation; and implanting dopants of the second conductivity type and dopants of the first conductivity type into the first side of the semiconductor body through the opening in the photoresist.

* * * * *